United States Patent [19]

Kasperkovitz

[11] 4,123,672
[45] Oct. 31, 1978

[54] CIRCUIT ARRANGEMENT FOR FREQUENCY DIVISION OF HIGH-FREQUENCY PULSES

[75] Inventor: Wolfdietrich G. Kasperkovitz, Eindhoven, Netherlands

[73] Assignee: U.S. Philips Corporation, New York, N.Y.

[21] Appl. No.: 802,725

[22] Filed: Jun. 2, 1977

Related U.S. Application Data

[63] Continuation of Ser. No. 635,987, Nov. 28, 1975, abandoned.

[30] Foreign Application Priority Data

Nov. 29, 1974 [NL] Netherlands .................... 7415575

[51] Int. Cl.² ........................................... H03K 21/00
[52] U.S. Cl. ................. 307/303; 307/220 R; 307/265; 357/46; 357/51
[58] Field of Search ........... 307/220 R, 220 C, 225 R, 307/225 C, 279, 303, 265; 357/46, 51

[56] References Cited

U.S. PATENT DOCUMENTS

| 3,681,617 | 8/1972 | Moriyasu | 307/225 R |
| 3,708,691 | 1/1973 | Gilbert | 357/46 |

OTHER PUBLICATIONS

Wu, "Flip-Flop with Subcollector Interconnectins", *IBM Technical Disclosure Bulletin*, vol. 14, No. 6, Nov. 1971, p. 1682.

*Primary Examiner*—Stanley D. Miller, Jr.
*Assistant Examiner*—James W. Davie
*Attorney, Agent, or Firm*—Frank R. Trifari; Jack E. Haken

[57] ABSTRACT

A circuit arrangement for the frequency division of high frequency pulses in which a cyclic sequence of transistors are connected together via tapped resistances. In integrated circuit technology the tapped resistances may be the parasitic resistance of a semiconductor layer which serves as a common collector for the transistors.

7 Claims, 3 Drawing Figures

CIRCUIT ARRANGEMENT FOR FREQUENCY DIVISION OF HIGH-FREQUENCY PULSES

This is a continuation of application Ser. No. 635,987, filed Nov. 28, 1975, now abandoned.

The invention relates to a circuit arrangement for the frequency division of high-frquency pulses, comprising a first pair of transistors which are alternately driven into conduction by the pulses and whose output currents are each passed through a group of at least two transistors.

Such a circuit arrangement is known from U.S. Pat. No. 3,681,617. In this known circuit arrangement a second transistor of the opposite conductivity type is added to each of the transistors of said groups, together forming a bistable trigger. From each bistable trigger a coupling circuit leads in a cyclically shifted sequence to another bistable trigger which belongs to another group for presetting said other bistable trigger in dependence on the energizing state of the one bistable trigger.

Said known circuit arrangement operates satisfactorily up to frequencies of 600 Megahertz. For still higher frequencies, for example 1 Gigahertz the use of additional transistors is not very possible due to the low efficiency of very high frequency transistors. The number of transistors should therefore be minimized for this purpose.

It is an object of the invention to provide a circuit arrangement of the type mentioned in the preamble for very high frequencies and the invention is characterized in that the input electrodes of the transistors of said groups are each time connected in a cyclically shifted sequence to tappings on resistors which connect the output electrodes of each time two different transistors of different groups.

In the circuit arrangement according to the invention no additional transistors are used and therefore a much larger bandwidth is obtained. Measurements conducted on a first experimental embodiment of a circuit arrangement according to the invention revealed a satisfactory behavior of the circuit arrangement at frequencies up to 1.3 GHz.

Apart from the minimum number of transistors required, the circuit arrangement according to the invention exclusively comprises the said resistors. Therefore, it is advantageous in a circuit arrangement according to the invention, executed in integrated circuit technology, with a semiconductor element in which the various transistors take the form of junction transistors, that in an island of a first conductivity type, which island functions as the common collector of at least the transistors of said groups, at least four mutually isolated base zones are provided of a second opposite conductivity type, geometrically arranged in a sequence which corresponds to said cyclic sequence, while the base zone of a transistor of the one group each time follows the base zone of a transistor of the other group, in which base zones emitter zones of the first conductivity type are formed, conductor tracks connecting the emitter zones of the transistors belonging to one group to each other and to the collector of the associated transistor of the transistors which are alternately driven into conduction, while via conductor tracks terminals on the base zones of the transistors of said groups are each time connected in a cyclically shifted sequence to terminals on said island between each time two adjacent other base zones, from which terminals the desired resistors lead to the collector-base depletion layers of the associated transistors, and a power-supply terminal contact is disposed on said island, from which desired resistors lead to the base-collector depletion layers of the transistors of said groups.

Said integrated circuit according to the invention is based on the recognition that the circuit arrangement according to the invention leads to a required resistor configuration which can be realized in a common collector semiconductor layer by utilizing the internal resistance of such a semiconductor layer, so that a very compact construction of the integrated circuit is possible.

In the collector semiconductor layer, which also constitutes the resistor configuration, the frequency divided signal propagates, as it were, as a travelling wave. It is inter alia this travelling-wave concept which explains the extremely satisfactory behavior at very high frequencies.

In an integrated circuit according to the invention it is advantageous that a highly-doped buried layer is formed in said island.

In an integrated circuit according to the invention it is furthermore of advantage that in said island underneath said connection points zones are provided of the same conductivity type as the conductivity type of said emitter zones.

The first further step has the advantage that said divided resistors are constituted by the internal resistance of the buried layer, while the second step has the advantage that the location of the connection points relative to the emitter zones is constant because the two can be realized in one diffusion step with one mask.

An integrated circuit according to the invention employing integration technology, oxide layers being provided to isolate various elements, is characterized in that an oxide layer surrounds said island.

The invention will be described in more detail with reference to the drawing.

Figure 1:
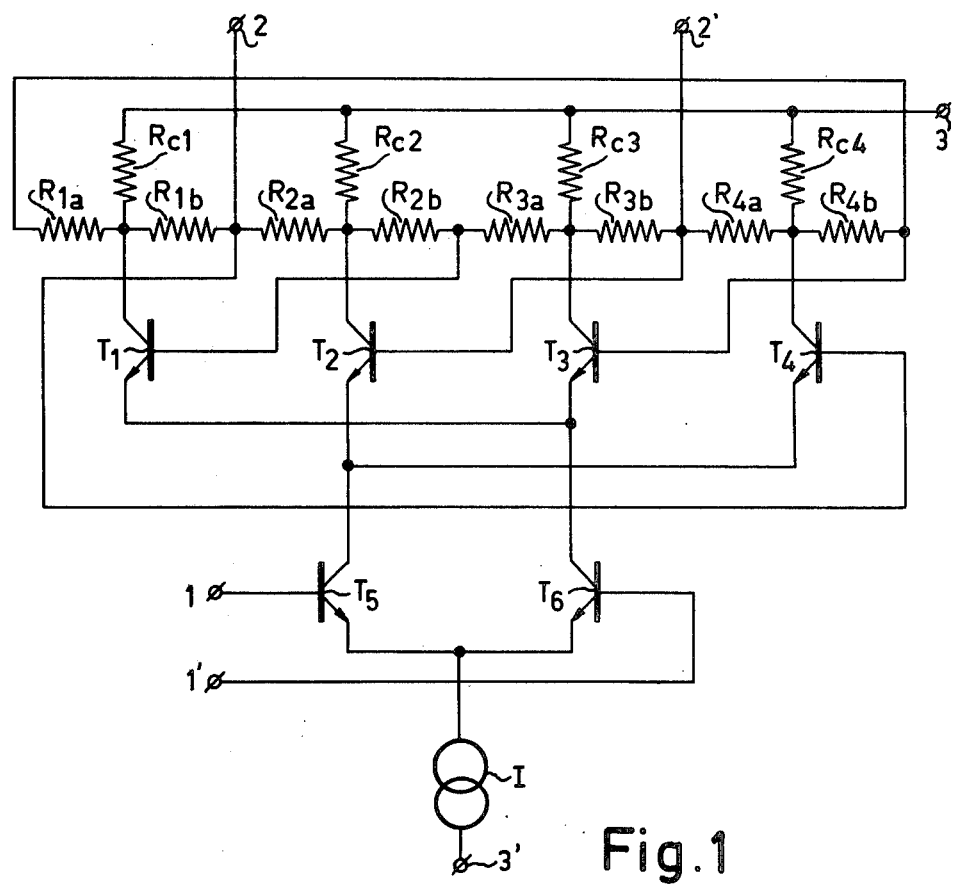
FIG. 1 shows the circuit diagram of the circuit arrangement contained in the integrated circuit according to the invention.

FIG. 1 shows a circuit arrangement according to the invention. The circuit arrangement comprises a first, second, third and fourth transistor, designated $T_1$, $T_2$, $T_3$ and $T_4$ respectively. The collectors of these transistors are connected to a power supply terminal 3 via the resistors $R_{c1}$, $R_{c2}$, $R_{c3}$ and $R_{c4}$ respectively. The emitters of the transistor $T_2$ and $T_4$ are jointly connected to the collector of an input transistor $T_5$, while the emitters of the transistors $T_1$ and $T_3$ are jointly connected to the collector of an input transistor $T_6$. The emitters of the input transistors $T_5$ and $T_6$ are jointly connected to a power-supply terminal 3', via a current source I, and the base electrodes to the input terminal 1 and 1' respectively.

The transistors $T_1$ and $T_3$ are connected as a bistable trigger in that the collector of transistor $T_1$ is connected to the base of transistor $T_3$ via the resistor $R_{1a}$ and the collector of transistor $T_3$ to the base of transistor $T_1$ via the resistor $R_{3a}$. Similarly, the transistors $T_2$ and $T_4$ are connected as a bistable trigger in that the collector of transistor $T_2$ is connected to the base of transistor $T_4$ via the resistor $R_{2a}$, and the collector of transistor $T_4$ to the base of transistor $T_2$ via the resistor $R_{4a}$. The collector of transistor $T_1$ is connected to the base of transistor $T_4$ via the resistor $R_{1b}$, the collector of transistor $T_2$ to the base of transistor $T_1$ via the resistor $R_{2b}$, the collector of transistor $T_3$ to the base of transistor $T_2$ via the resistor $R_{3b}$, and the collector of transistor $T_4$ to the base of transistor $T_3$ via the resistor $R_{4b}$.

In order to obtain an output signal the connection point between the resistors $R_{1b}$ and $R_{2a}$ in the embodiment shown is connected to an output terminal 2 and the connection point between the resistors $R_{3b}$ and $R_{4a}$ to an output terminal 2'.

To explain the operation of the circuit arrangement of FIG. 1 it is assumed that the input signal is such that the base of transistor $T_6$ has a higher potential than the base of transistor $T_5$. The current from the current source I will then flow entirely through the collector-emitter path of transistor $T_6$ provided that the potential at the base of transistor $T_6$ is sufficiently high relative to the potential at the base of the transistor $T_5$. This current then flows in the common emitter circuit of the transistors $T_1$ and $T_3$. These two transistors are connected as a bistable trigger, so that only one of the two transistors can conduct. When it is assumed that transistor $T_1$ is conductive, the other three transistors $T_2$, $T_3$ and $T_4$ will not conduct and the potential at the collector of transistor $T_1$ will be low relative to the potential of the collectors of the other three transistors. Due to the coupling resistors the potential at the bases of the transistors $T_3$ and $T_4$ is then low relative to the potential at the bases of the transistors $T_1$ and $T_2$, so that transistor $T_3$, which together with transistor $T_1$ constitutes a bistable trigger, remains reverse biassed and the potential at the base of transistor $T_2$, which together with transistor $T_4$ constitutes a bistable trigger, is high relative to the potential at the base of transistor $T_4$. At the instant that the input transistor $T_5$ is biassed in the forward direction by the input signal, transistor $T_2$ will consequently have preference over transistor $T_4$, so that transistor $T_2$ becomes conductive and via the resistor $R_{2a}$ keeps transistor $T_4$ reverse biassed. Via the resistor $R_{2b}$ the potential at the base of transistor $T_1$ is kept low relative to the potential at the base of transistor $T_3$, so that at the instant that input transistor $T_6$ begins to conduct the current from the current source, transistor $T_3$ becomes conductive. Similarly, at the instant that input transistor $T_5$ becomes conductive, transistor $T_4$ will take over the current from transistor $T_3$.

In the manner described above, the current from the current source I is transferred to a subsequent transistor upon each zero passage of the input signal. A full cycle has been completed after two cycles of the input signal, so that frequency division is obtained.

Figure 2:
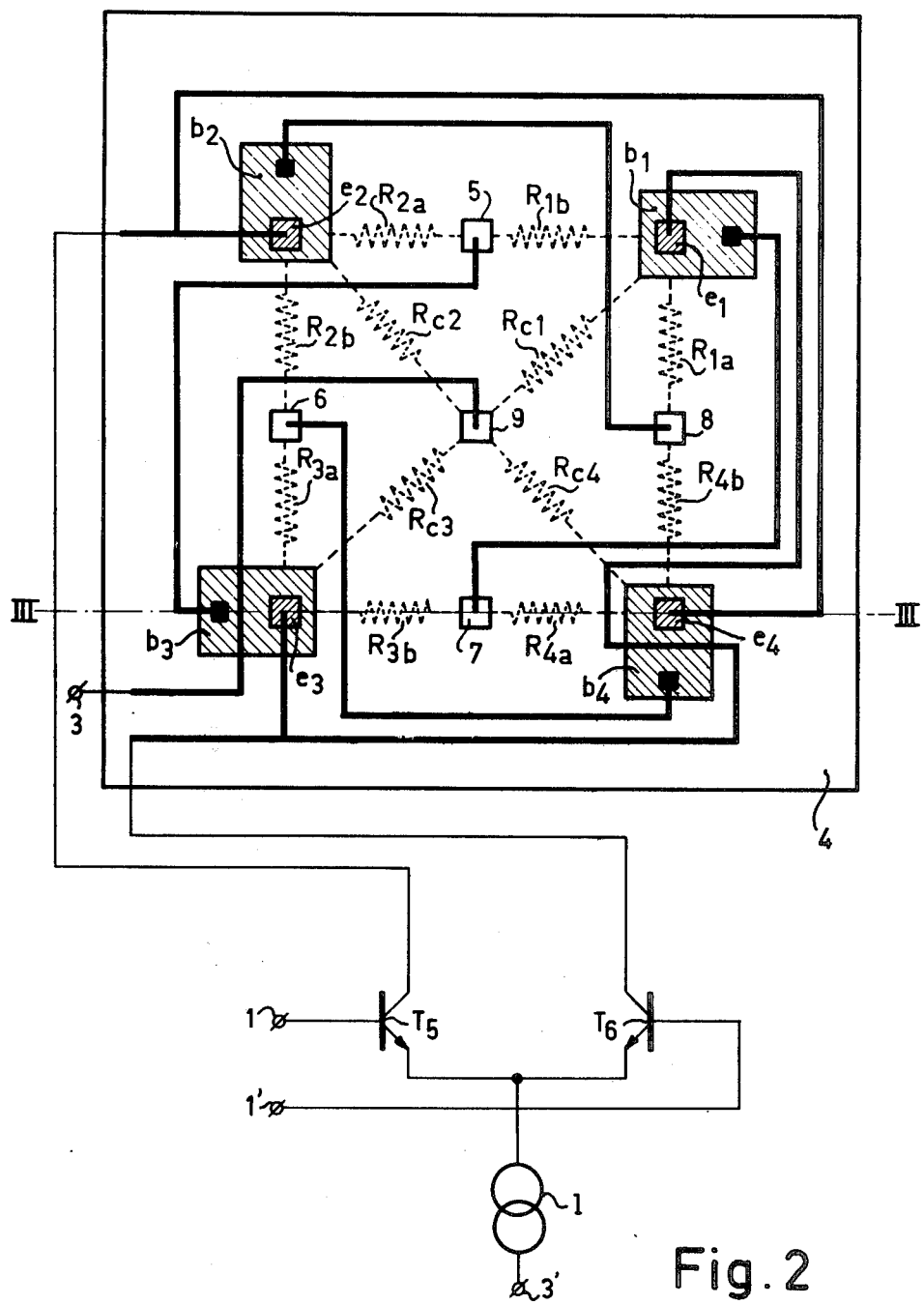
FIG. 2 shows the plan view of an embodiment of an integrated circuit according to the invention.

For illustration FIG. 2 shows a schematically represented structure in a semiconductor body of the circuit arrangement of FIG. 1. The driver stage consisting of the input transistors $T_5$ and $T_6$ is not shown in integrated form because various solutions are possible for this. The input transistors $T_5$ and $T_6$ will generally be included in an integrated circuit together with other circuits, which integrated circuit, also incorporates the, isolated, semiconductor island in which the four transistors and the resistor network is accommodated.

In such a semiconductor island 4 of a first conductivity type, for example the n-type, four base zones $b_1$, $b_2$, $b_3$ and $b_4$ of a second conductivity type, for example the p-type are formed by diffusion. In these base zones, in their turn, emitter zones $e_1$, $e_2$, $e_3$ and $e_4$ are formed of the first conductivity type, for example the $n^+$-type. Thus, the four transistors $T_1$, $T_2$, $T_3$ and $T_4$ are formed, of which transistors the collectors are constituted by the semiconductor island 4, the bases of the base zones $b_1$, $b_2$, $b_3$ and $b_4$ respectively and the emitters by the emitter zones $e_1$, $e_2$, $e_3$ and $e_4$ respectively. Centrally, among the four transistors a power supply terminal 9 is arranged on the semiconductor island 4, from which a conductor track leads to the terminal 3. Between the base zones of the transistors $T_1$, $T_2$, $T_3$ and $T_4$ terminals 5, 6, 7 and 8 are arranged in a cyclically shifted sequence, for example the terminal 5 between the base zones of the transistor $T_1$ and $T_2$. From these terminals 5, 6, 7 and 8 conductor tracks lead to the bases of each time a transistor other than an adjacent transistor in a cyclically shifted sequence, for example from the terminal 5 to the base zone $b_3$. Due to the internal resistance of the semiconductor material from which the collector semiconductor layer 4 is made, the various resistors $R_{c1} - R_{c4}$, $R_{1a} - R_{4a}$ and $R_{1b} - R_{4b}$ lead to the relevant base-collector depletion layers. These resistors are shown dashed in FIG. 2.

A conductor track connects the emitter zones $e_2$ and $e_4$ to the collector of input transistor $T_5$, and similarly a conductor track connects the emitter zones $e_1$ and $e_3$ to the collector of input transistor $T_6$. These input transistors $T_5$ and $T_6$, which may for example also be of the isulated-gate type, are located outside the semiconductor island 4. This semiconductor island 4 will therefore be surrounded by an isolation diffusion. It is also very favourable to use an integration technique in which the isolation layer is obtained by local oxidation of the silicon.

The terminals 5, 6, 7, 8 and 9 may be formed directly on the semiconductor island 4, but also on diffusions formed on the island, which diffusions are of the same material as the emitter diffusions $e_1$, $e_2$, $e_3$ and $e_4$, for example an $n^+$ diffusion in the case of an n-type semiconductor island 4. This has the advantage that this can be effected simultaneously with the emitter diffusions. As a result, the location of the terminals 5–9 is defined relative to the location of the emitter diffusions, which is advantageous because in the case of high frequency transistors the transistor action mainly takes place directly underneath the emitter zone, so that the various resistors are not or hardly changed upon a displacement of the relevant diffusion mask.

Since the internal resistance of the semiconductor material from which the collector layer 4 is made is generally comparatively high, a buried layer 12 of the same conductivity type but more heavily doped than the semiconductor material of the island 4, is used underneath the base zones $b_1$-$b_4$. The various resistors are then mainly located in said buried layer 12.

In addition to the structure of the integrated circuit according to the invention shown in FIG. 2, various other structures are possible, for example a structure in which the transistors $T_1$-$T_4$ are disposed in line, while the two ends of the island 4 which is then oblong, must then be connected by a semiconductor track in order to obtain a cyclic circuit arrangement.

Figure 3:
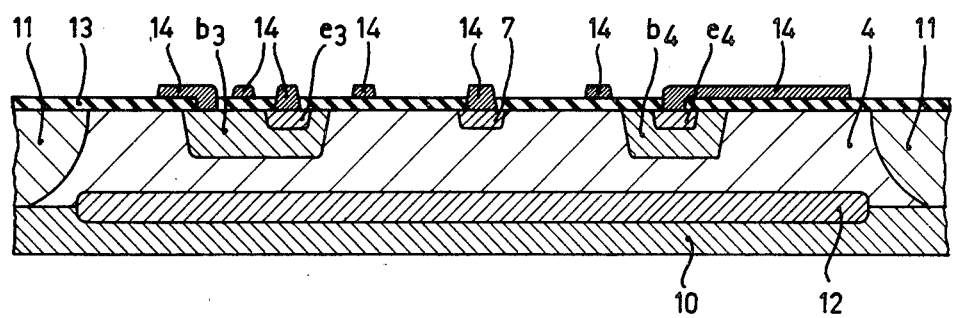
FIG. 3 shows a cross-section of the integrated circuit of FIG. 2 at the line III—III.

FIG. 3 shows a cross-section of the integrated circuit of FIG. 2 at the line III—III.

On a substrate 10, which may be in common with the substrate of further integrated circuits and which is of the second conductivity type, for example p-type, the semiconductor island 4 is formed, isolated from further integrated circuits by isolation regions 11, for example $p^+$ isolation diffusions. In this island a buried layer 12 of the heavily doped first conductivity type, for example $n^+$, is formed. Furthermore, FIG. 2 shows the base diffusions $b_3$ and $b_4$ and the emitter diffusions $e_3$ and $e_4$, which are visible in this sectional view. The terminal 7 is formed by diffusion together with the emitter diffusions, for example an $n^+$ diffusion. On this structure an isolation layer 13 is superimposed on which the various conductor tracks 14 are arranged, openings being formed in said isolation layer 13 at various locations, so as to enable contacts with the underlaying active regions. The resistors $R_{3b}$ and $R_{4a}$ are constituted by the resistances of the connection paths from the terminal 7 via the buried layer 12 to the base-collector junctions associated with the base-diffusions $b_3$ and $b_4$ respectively.

It will be evident that the invention is not limited to the structure shown. Many solutions are possible, while in respect of the transistors $T_5$ and $T_6$ it is also possible to use transistor types other than those shown.

Although the circuit arrangements shown are limited to groups of two transistors each, it will be obvious that in similar way transistors may be added to each group as required. If each group comprises $n$ transistors, the circuit arrangement divides the frequency of the pulses by $n$.

What is claimed is:

1. A circuit comprising:
   first and second equal sized groups of transistors, each group having at least one pair of transistors, a cyclic electrical sequence being defined for said transistors, said sequence alternating between said groups so that each of said transistors is followed in said sequence by a transistor of the other group, each of said transistors having a collector, a base and an emitter;
   a plurality of electrical resistances, each of said resistances connecting the collector of a transistor in said cyclic sequence to the collector of the following transistor in said sequence, each of said electrical resistances having a tapping electrically connected directly to the base of the transistor which preceedes, in said sequence, the pair of transistors between the collectors of which said tapping is disposed;
   first and second driver transistors, the output from said first driver transistor being electrically connected to each of the emitters of the transistors of said first group, the output from said second driver transistor being electrically connected to each of the emitters of the transistors of said second group;
   means for alternately driving said first and second driver transistors into conduction; and
   output means electrically connected to at least one of said tappings.

2. An integrated embodiment of the circuit of claim 1, wherein each of said transistors is a junction transistor, comprising:
   a semiconductor element including an island of a first conductivity type which island function as the common collector of at least the transistors in said groups;
   at least four mutually isolated base zones of a second opposite conductivity type disposed in said island in a cyclic physical sequence which corresponds to said electrical sequence with the base zone of each transistor of one group following the base zone of a transistor of the other group;
   emitter zones of said first conductivity type formed in each of said base zones;
   conductor means connecting each of said emitter zones in the same group to the collector of the associated driver transistor and further connecting said base zone of each of said transistors in said physical sequence to a tap terminal on said island which is disposed between the next two following base zones in said cyclic physical sequence;
   said electrical resistances connecting said tap terminals to collector-base depletion layers of said next two following base zones; and
   further electrical resistances connecting each of said depletion layers to a power supply contact disposed on said island.

3. A circuit embodiment as claimed in claim 2 further comprising a central terminal which forms said power supply contact and wherein:
   said base zones are symmetrically disposed around said central terminal; said tap terminals being disposed between said base zones.

4. A circuit arrangement as claimed in claim 2 wherein said island includes a heavily-doped buried layer therein.

5. A circuit embodiment as claimed in claim 2 wherein the portions of said island underlying said tap terminals are of said first conductivity type.

6. A circuit embodiment as claimed in claim 2 wherein an oxide isolation layer surrounds said island.

7. A circuit for dividing the frequency of high frequency pulses by two, comprising:
   a first transistor;
   a second transistor;
   a third transistor;
   a fourth transistor;
   a first resistance connecting the collector of said first transistor to the collector of said second transistor and having a first tap connected directly to the base of said fourth transistor;
   a second resistance connecting the collector of said second transistor to the collector of said third transistor and having a tap connected to the base of said first transistor;
   a third resistance connecting the collector of said third transistor to the collector of said fourth transistor and having a tap connected to the base of said second transistor;
   a fourth resistance connecting the collector of said fourth transistor to the collector of said first transistor and having a tap connected to the base of said third transistor;
   output means connected to at least one of said taps;
   a fifth transistor having a collector connected to the emitters of said second transistor and of said fourth transistor;
   a sixth transistor having a collector connected to the emitters of said first transistor and of said third transistor; and
   means for alternately driving said fifth transistor and said sixth transistor into conduction by said pulses.

* * * * *